United States Patent
Limbach et al.

(10) Patent No.: US 8,659,745 B2
(45) Date of Patent: *Feb. 25, 2014

(54) OPTICAL SYSTEM WITH AN EXCHANGEABLE, MANIPULABLE CORRECTION ARRANGEMENT FOR REDUCING IMAGE ABERRATIONS

(71) Applicant: Carl Zeiss SMT GmbH, Oberkochen (DE)

(72) Inventors: Guido Limbach, Aalen (DE); Franz Sorg, Aalen (DE); Armin Schoeppach, Aalen (DE); Ulrich Weber, Ulm (DE); Ulrich Loering, Schwaebisch Gmuend, DE (US); Dirk Hellweg, Aalen (DE); Peter Meyer, Beverungen (DE); Stefan Xalter, Oberkochen (DE); Jens Kugler, Aalen (DE); Bernhard Gellrich, Aalen (DE); Stefan Hembacher, Bobingen (DE); Bernhard Geuppert, Aalen (DE); Aksel Goehnermeier, Essingen-Lauterburg (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/921,312

(22) Filed: Jun. 19, 2013

(65) Prior Publication Data

US 2013/0278911 A1    Oct. 24, 2013

Related U.S. Application Data

(63) Continuation of application No. 12/409,961, filed on Mar. 24, 2009, which is a continuation of application No. PCT/EP2007/010286, filed on Nov. 27, 2007.

(30) Foreign Application Priority Data

Dec. 1, 2006  (DE) .......................... 10 2006 057 207

(51) Int. Cl.
*G03B 27/52*  (2006.01)
(52) U.S. Cl.
USPC ................... 355/67; 355/52; 355/55; 355/77
(58) Field of Classification Search
USPC ......................................... 355/52, 55, 67, 77
See application file for complete search history.

(56) References Cited

U.S. PATENT DOCUMENTS

| 3,305,294 A | 2/1967 | Alvarez |
| 5,392,119 A | 2/1995 | McArthur et al. |

(Continued)

FOREIGN PATENT DOCUMENTS

| CN | 1 371 027 | 9/2002 |
| DE | 10 2005 030543 | 2/2006 |

(Continued)

OTHER PUBLICATIONS

Chinese Office Action, with translation thereof, for corresponding Appl No. 200780044525.3, dated Apr. 11, 2013.

(Continued)

*Primary Examiner* — Thomas R Artman
(74) *Attorney, Agent, or Firm* — Fish & Richardson P.C.

(57) ABSTRACT

The disclosure relates to an optical system, such as a projection exposure apparatus for semiconductor lithography, including a manipulable correction arrangement for reducing image aberrations. In some embodiments, the system includes at least one manipulator configured to reduce image aberrations. The manipulator can include at least one optical element which can be manipulated by at least one actuator. The manipulator can be formed in changeable fashion together with an actuator.

32 Claims, 14 Drawing Sheets

(56) References Cited

U.S. PATENT DOCUMENTS

| | | |
|---|---|---|
| 5,638,223 A | 6/1997 | Ikeda |
| 5,677,757 A | 10/1997 | Taniguchi et al. |
| 5,757,017 A | 5/1998 | Braat |
| 5,789,734 A | 8/1998 | Torigoe et al. |
| 5,973,863 A | 10/1999 | Hatasawa et al. |
| 6,104,472 A | 8/2000 | Suzuki |
| 6,247,818 B1 | 6/2001 | Hedblom et al. |
| 6,266,389 B1 | 7/2001 | Murayama et al. |
| 6,312,373 B1 | 11/2001 | Ichihara |
| 6,333,776 B1 | 12/2001 | Taniguchi et al. |
| 6,353,470 B1 | 3/2002 | Dinger |
| 6,366,410 B1 | 4/2002 | Schultz et al. |
| 6,522,390 B2 | 2/2003 | Suzuki et al. |
| 6,639,651 B2 | 10/2003 | Matsuyama |
| 6,639,696 B1 | 10/2003 | Nishio |
| 6,727,980 B2 | 4/2004 | Ota et al. |
| 6,995,930 B2 | 2/2006 | Shafer et al. |
| 7,177,076 B2 | 2/2007 | Mann et al. |
| 7,253,880 B2 | 8/2007 | Loopstra et al. |
| 7,283,204 B2 | 10/2007 | Wegmann |
| 7,408,616 B2 | 8/2008 | Gruner et al. |
| 7,436,484 B2 | 10/2008 | Van Der Wijst et al. |
| 7,576,928 B2 * | 8/2009 | Tanabe et al. .................. 359/819 |
| 7,724,351 B2 | 5/2010 | Loopstra et al. |
| 8,027,024 B2 | 9/2011 | Gellrich et al. |
| 8,203,696 B2 | 6/2012 | Bittner et al. |
| 2001/0019403 A1 | 9/2001 | Schuster et al. |
| 2001/0038500 A1 | 11/2001 | Shibazaki |
| 2002/0008863 A1 | 1/2002 | Taniguchi et al. |
| 2002/0167740 A1 | 11/2002 | Osterried et al. |
| 2002/0171922 A1 | 11/2002 | Shiraishi et al. |
| 2002/0183977 A1 | 12/2002 | Sui et al. |
| 2003/0081722 A1 | 5/2003 | Kandaka et al. |
| 2004/0042094 A1 | 3/2004 | Matsuyama |
| 2004/0112866 A1 | 6/2004 | Maleville et al. |
| 2005/0057827 A1 | 3/2005 | Miyachi et al. |
| 2005/0134972 A1 | 6/2005 | Kugler et al. |
| 2005/0146704 A1 | 7/2005 | Gruner et al. |
| 2005/0286121 A1 | 12/2005 | Weber et al. |
| 2006/0007418 A1 | 1/2006 | Hamatani et al. |
| 2006/0028706 A1 | 2/2006 | Totzeck et al. |
| 2006/0055909 A1 | 3/2006 | Fiolka et al. |
| 2006/0109442 A1 | 5/2006 | Loopstra et al. |
| 2006/0139585 A1 | 6/2006 | Van Der Wijst et al. |
| 2006/0176460 A1 | 8/2006 | Phillips et al. |
| 2006/0230413 A1 | 10/2006 | Rassel et al. |
| 2007/0014560 A1 | 1/2007 | Hylen et al. |
| 2007/0177122 A1 | 8/2007 | Loopstra et al. |
| 2008/0316444 A1 | 12/2008 | Sorg et al. |
| 2009/0153829 A1 | 6/2009 | Rogalsky et al. |
| 2010/0014065 A1 | 1/2010 | Gruner et al. |
| 2010/0066990 A1 | 3/2010 | Bieg et al. |
| 2010/0149517 A1 | 6/2010 | Mann et al. |
| 2011/0069296 A1 | 3/2011 | Gruner et al. |
| 2011/0228226 A1 | 9/2011 | Pixton et al. |

FOREIGN PATENT DOCUMENTS

| | | |
|---|---|---|
| DE | 10 2005 015627 | 10/2006 |
| EP | 0 724 199 | 7/1996 |
| EP | 0 851 304 | 7/1998 |
| EP | 0 969 327 | 1/2000 |
| EP | 1 231 516 | 8/2002 |
| EP | 1 672 431 | 6/2006 |
| JP | 05 234850 | 9/1993 |
| JP | 6-326000 | 11/1994 |
| JP | 8-241861 | 9/1996 |
| JP | 9-190969 | 7/1997 |
| JP | 10-054932 | 2/1998 |
| JP | 10 125590 | 5/1998 |
| JP | 10-142555 | 5/1998 |
| JP | 10-242048 | 9/1998 |
| JP | 2001-196305 | 7/2001 |
| JP | 2002-203767 A | 7/2002 |
| JP | 2002-324752 | 11/2002 |
| JP | 2004-506236 | 2/2004 |
| JP | 2005-513517 | 5/2005 |
| JP | 06 177008 | 6/2005 |
| JP | 2005-202375 | 7/2005 |
| JP | 2006-041540 | 2/2006 |
| JP | 2006-073584 | 3/2006 |
| JP | 2000-321027 | 11/2008 |
| JP | 2000-321028 | 11/2008 |
| JP | 2000-321029 | 11/2008 |
| JP | 2000-321031 | 11/2008 |
| JP | 2000-321039 | 11/2008 |
| KR | 10-2002-0067012 | 8/2002 |
| WO | WO 02/12948 | 2/2002 |
| WO | WO 03/050609 | 6/2003 |
| WO | WO 03/075096 | 9/2003 |
| WO | WO 2004/019128 | 3/2004 |
| WO | WO 2004/086148 | 10/2004 |
| WO | WO 2005/031467 | 4/2005 |
| WO | WO 2005/050322 | 6/2005 |
| WO | WO 2005/064404 | 7/2005 |
| WO | WO 2005/069055 | 7/2005 |
| WO | WO 2006/014595 | 2/2006 |
| WO | WO 2006/053751 | 5/2006 |
| WO | WO 2006/121009 | 11/2006 |
| WO | WO 2006/126522 | 11/2006 |
| WO | WO 2007/000984 | 1/2007 |
| WO | WO 2007/022922 | 3/2007 |
| WO | WO 2007/085290 | 8/2007 |
| WO | WO 2008/003442 | 1/2008 |

OTHER PUBLICATIONS

International Search Report and a Written Opinion from the counterpart PCT Application No. PCT/EP2007/010286, filed Nov. 27, 2007.

Chinese Office Action, with English translation, for corresponding CN Application No. 200780044525.3, dated Feb. 29, 2012.

Japanese Office Action, with English translation, for corresponding JP Appl No. 2009-538631, dated May 21, 2012.

* cited by examiner

OPTICAL SYSTEM WITH AN EXCHANGEABLE, MANIPULABLE CORRECTION ARRANGEMENT FOR REDUCING IMAGE ABERRATIONS

CROSS-REFERENCE TO RELATED APPLICATIONS

This application is a continuation of, and claims benefit under 35 USC 120 to, U.S. application Ser. No. 12/409,961, filed Mar. 24, 2009, which is a continuation of, and claims benefit under 35 USC 120 to, international application PCT/EP2007/010286, filed Nov. 27, 2007, which claims benefit of German Application No. 10 2006 057 207.6, filed Dec. 1, 2006. U.S. application Ser. No. 12/409,961 and International application PCT/EP2007/010286 are hereby incorporated by reference.

FIELD

The disclosure relates to an optical system, such as a projection exposure apparatus for semiconductor lithography, including a manipulable correction arrangement for reducing image aberrations.

BACKGROUND

In many optical systems, such as projection exposure apparatuses for semiconductor lithography, for example, the electromagnetic radiation used for exposure is also absorbed as an undesirable effect—alongside the desirable refraction or reflection—in the optical elements used, such as lenses or mirrors, for example. The power absorbed in the process often leads to a generally inhomogeneous heating of the optical elements. As a consequence of the temperature-induced changes in the refractive index, expansions and mechanical stresses, the optical system is disturbed, which leads to aberrations of the wavefront propagating in the optical system and thus to an impairment of the imaging quality.

FIG. 1 illustrates an example of a prior art projection exposure apparatus 1 for semiconductor lithography. This apparatus serves for the exposure of structures onto a substrate coated with photosensitive materials, which substrate is generally predominantly composed of silicon and is referred to as wafer 2, for the production of semiconductor components, such as, for example, computer chips.

In this case, the projection exposure apparatus 1 includes an illumination device 3, a device 4 for receiving and exactly positioning a mask provided with a structure, a so-called reticle 5, which is used to determine the later structures on the wafer 2, a device 6 for the mounting, movement and exact positioning of precisely the wafer 2, and an imaging device, namely a projection objective 7, with a plurality of optical elements 8 which are mounted via mounts 9 in an objective housing 10 of the projection objective 7.

In this case, the basic functional principle provides for imaging the structures introduced into the reticle 5 onto the wafer 2. After exposure has been effected, the wafer 2 is moved further in the arrow direction, such that a multiplicity of individual fields, each having the structure prescribed by the reticle 5, are exposed on the same wafer 2. On account of the step-by-step advancing movement of the wafer 2 in the projection exposure apparatus 1, the latter is often also referred to as a stepper. In order to improve the process parameters, in the step-and-scan systems in this case the reticle 5 is continuously scanned through a slotted diaphragm.

The illumination device 3 provides a projection beam 11 used for the imaging of the reticle 5 on the wafer 2, for example light or a similar electromagnetic radiation. A laser or the like can be used as a source for this radiation. The radiation is shaped in the illumination device 3 via optical elements in such a way that the projection beam 11, upon impinging on the reticle 5, has the desired properties with regard to diameter, polarization, shape of the wavefront and the like.

Via the projection beam 11, an image of the reticle 5 is generated and transferred to the wafer 2 correspondingly by the projection objective 7 as has already been explained above. The projection objective 7 has a multiplicity of individual refractive, diffractive and/or reflective optical elements such as e.g. lenses, mirrors, prisms, terminating plates and the like.

The step-and-scan systems described above usually exhibit a scanner slot formed in approximately rectangular fashion, which has the effect that the optical conditions in the scanning direction and perpendicularly thereto are different. This symmetry breaking in the field leads to second-order intensity distributions and thus to second-order disturbances in the vicinity of field planes of the system, that is to say usually on optical elements in the vicinity of the wafer 2 and the reticle 5. In this case, the expression "nth-order" intensity distributions is understood to mean distributions which have a symmetry such that they are transformed into themselves upon a rotation through 360°/n, where n represents a natural number.

This can result in astigmatic image aberrations whose field distribution often contains considerable constant, but also quadratic components. At the same time, moreover, specific field distributions of further aberrations are induced. So-called anamorphism in the case of distortion shall be mentioned here as the most important example. The effects caused by the symmetry breaking in the field have almost always the same sign and similar relationships for a large class of settings, since the intensity distribution brought about by the scanner slot on the lenses near the field is relatively independent of the settings used.

The angular distribution of the illumination setting and also the diffraction effects at the reticle determine the symmetry of the angular distribution of the electromagnetic radiation used. This angular distribution translates into a corresponding intensity distribution and thus into a temperature distribution of the same symmetry in the optical elements near the pupil.

Let us consider the following example for elucidating the disclosure:

During the design phase of a projection exposure apparatus and in particular when selecting the manipulators, illumination settings with very specific symmetries might not yet have been taken into account, for example. In this case, only disturbances with second-order symmetry which originate from the abovementioned symmetry breaking of the rectangular scanner slot are typically considered during the design. As a consequence, only a manipulator which is positioned near the field (where the aforementioned disturbances arise) and which, e.g., by compensating second-order disturbance, e.g. a deformation (in the preferred direction prescribed by the orientation of the scanner slot), corrects the astigmatic image aberrations and the anamorphism in the "correct" (more or less universal) relationship is provided during the design phase. FIG. 1 illustrates such a manipulator with the reference symbol 8' way of example.

Examples of the use of manipulators are found in the prior art in particular in EP0851304 A2 and also in JP10142555.

For the case where the desired properties made of the projection exposure apparatus change over the course of time, the above-described design of the system proves to be inadequate, however. Thus, it can already be foreseen at the present time that the main emphasis of the applications in the case of many semiconductor manufacturers is shifting to different products than originally planned, for example to the production of flash memories. In order to increase the resolution, a dipole illumination distinguished by two localized poles in the pupil can be used in such applications. Dipoles in the x direction or in the y direction are the most common, as illustrated in FIG. 2 by way of example in subfigures 2a and 2b. In this case, FIG. 2a shows by way of example a so-called x dipole, while FIG. 2b shows a y dipole.

This additional symmetry breaking in the pupil leads, particularly in lenses near the pupil, to a linear combination of greatly second-, fourth-, sixth- and possibly even higher-order temperature distributions. Moreover, the applications tend toward ever more extreme dipoles with ever smaller aperture angles (less than 25°) and ever smaller ring widths of the poles (down to $\Delta\sigma \ll 0.1$).

In contrast to the effects near the field which are caused by the scanner slot, in this example the symmetry breaking in the pupil leads to symmetry-breaking lens heating (LH) effects in the lenses near the pupil, where it causes an additional astigmatism offset which can have both signs (depending on the orientation of the dipole or the structures to be imaged). At the same time (depending on the aperture angle of the dipole) constant higher-order (e.g. fourth-order, sixth-order, etc.) image aberrations are also induced.

If—as discussed in this example—a (unidirectional) manipulator for the compensation of second-order disturbances is only positioned near the field and no additional manipulator exists in proximity to the pupil, which would actually be involved in order to correct the additional dipole-induced aberrations (depending on orientation X and Y in both directions) at a suitable position (near the pupil), this leads to the following problems:

- Although the manipulator near the field can also concomitantly correct a certain portion of the astigmatism offset of the X dipole, nevertheless the anamorphism is then overcompensated for (considerably under certain circumstances) and thus set parasitically by the manipulator near the field. Other parasitic image aberrations also reduce the correction potential of the element near the field.
- In the case of the Y dipole, the lens heating induced astigmatism component from the pupil overcompensates for the astigmatism component from the field. Overall, astigmatism is established with a sign that cannot be corrected by the unidirectional manipulator. However, even if the manipulator near the field were bidirectional, a considerable anamorphism (and other image aberrations) would again be established parasitically.

In the example considered here, therefore, an additional manipulator would be involved in the vicinity of the pupil, which additional manipulator can compensate for the second-order (and possibly also higher-order) disturbances of the lenses near the pupil in both directions. A possible position of such a manipulator is indicated by the manipulator with the reference symbol 8" in FIG. 1.

SUMMARY

In some embodiments, the disclosure provides an optical system which exhibits an increased flexibility with regard to adaptation to changing desired properties for a system.

An optical system, such as a projection exposure apparatus for semiconductor lithography, for example, can include at least one manipulator for reducing image aberrations. In this case, the manipulator can have at least one optical element which can be manipulated by at least one actuator, and is formed in changeable fashion in the optical system.

The manipulator can be an essentially plane-parallel plate—which is arranged in the basic mount—in the vicinity of a pupil of the projection objective, which is equipped with actuators. This can open up the possibility of retrofitting a projection exposure apparatus that has been in use for some time to the effect that a rigid plate used previously is replaced by a plate or a combination of plates with manipulator functionality. Moreover, this can permit a plate with manipulator functionality to be replaced by a plate or a combination of plates which has, with respect to the first-mentioned plate, an increased functionality or functionality different therefrom. This makes it possible to flexibly and actively correct thermally induced disturbances which occur for the first time on account of changed settings with new symmetries.

In some embodiments, the manipulator is arranged at a distance from a pupil of the system which corresponds to a paraxial subaperture ratio of a magnitude of less than 0.25, such as less than 0.1.

The paraxial subaperture ratio is given by $$signy_i \cdot \frac{y_i}{|y_i| + |\bar{y}_i|}$$

where $y_i$ denotes the paraxial marginal ray height and $\bar{y}_i$ denotes the paraxial principal ray height. A definition of the paraxial marginal ray and paraxial principal ray is given in "Fundamental Optical Design" by Michael J. Kidger, SPIE PRESS, Bellingham, Wash., USA, which is incorporated by reference herein.

The paraxial subaperture ratio is a signed variable that is a measure of the field or pupil proximity of a plane in the beam path. The subaperture ratio is normalized by definition to values of between −1 and 1, in which case for example a paraxial subaperture ratio of +1 or −1 is assigned to each field plane and a paraxial subaperture ratio of 0 is assigned to each pupil plane. For the present application, paraxial subaperture ratios of +1 or −1 correspondingly denote field planes, while a subaperture ratio of 0 determines pupil planes. Planes near the field therefore have paraxial subaperture ratios of +1 or −1, while planes near the pupil have a subaperture ratio in the region of 0. The sign indicates the position of the plane before or behind a reference plane. By way of example, the sign of the piercing point of a coma ray in the relevant area can be used for definition.

The following concepts, in particular, are conceivable for the realization of the manipulator:

Deformable optical element with the possibility of bidirectional astigmatic deformation and/or with possibilities of higher-order deformation, e.g. fourth-order deformations or else higher-order deformations. In order to reduce the structural space taken up by the actuators, the latter could be realized for example as piezoactuators or special piezo-films. The actuators can likewise be formed as piezoactuators, Lorentz actuators, thermal, pneumatic or hydraulic actuators.

Thermal heating or cooling: in the region of the edge of the optical element, cooling or heating is effected, whereby a temperature distribution of suitable order is induced in the optical element and compensates for the effects induced by the lens heating. The cooling or heating is effected for example by Peltier elements arranged at the edge of the optical element or by cooling or heating of lens regions via convection by air flow introduced in a targeted manner. As an alternative, the optical element could also be heated over the whole area by laser light sources. In this case, it can be advantageous if a wavelength which does not correspond to the operating wavelength of the optical system and at which the absorption of the material of the optical element is particularly great is used for heating.

In this case, in order to bring the laser light to the desired position on the optical element, optical fibers can advantageously be used as optical waveguides.

The thermal heating can also be effected over the whole area by a suitable arrangement of heating wires within and outside the optically used region. In this case, the heating wires and feed lines are distributed and dimensioned in such a way that diffraction effects and shadings at this structure have only little influence on the imaging quality.

A splitting of the manipulator into two or more plates in conjunction with an aspherization of in each case two surfaces that can be rotated, tilted or displaced relative to one another with aspheres of suitable order is also advantageous. In this case, it should be taken into consideration that in the "0 position" of the arrangement, the optical effects of the surfaces compensate for one another and the amplitude and the orientation of a compensating disturbance of specific order can be set with the absolute and relative rotation. In order to maintain the exchange functionality with regard to the correction of lifetime effects by suitable aspherization, it is advantageous to provide an additional plate, which does not concomitantly rotate, for the correction asphere. In other words, the manipulator exhibits two plates that can be rotated relative to one another and also a stationary correction asphere.

One advantage that can be important is that the optical system can be adapted to new conditions and desired properties in the field, that is to say during use. This has the effect of obviating the costly exchange of the entire system for a retrofit or an upgrade or else in the case of a defect. With suitable fast changers it is even conceivable, for every application (that is to say for every setting), that runs on a projection exposure apparatus, to equip the projection objective in each case with the manipulator correspondingly optimized for the setting.

BRIEF DESCRIPTION OF THE DRAWINGS

Some variants, embodiments and effects of the disclosure are explained by way of example below with reference to the figures, in which.

DETAILED DESCRIPTION

Figure 1:
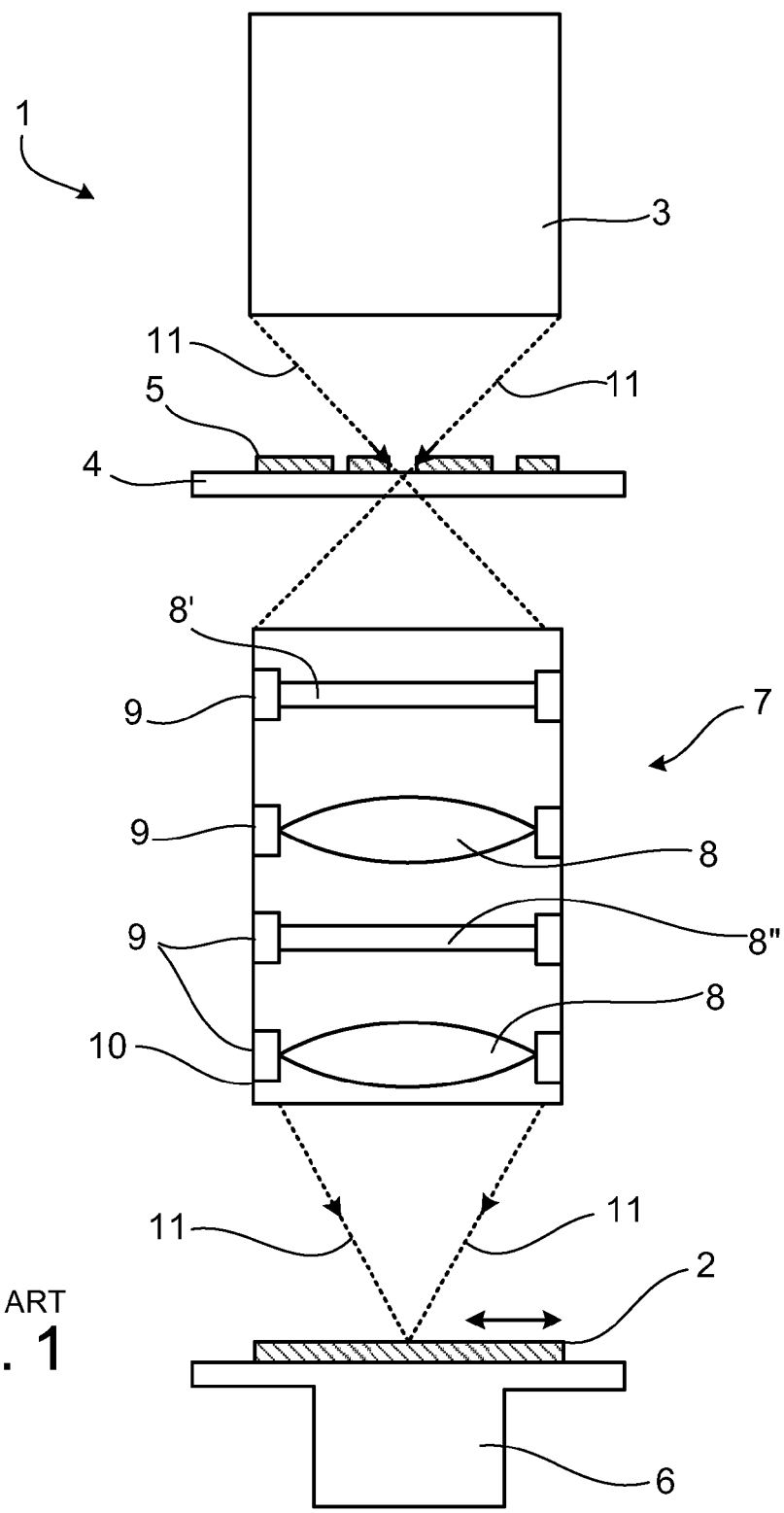
FIG. 1 shows a prior art projection exposure apparatus.
Figure 2A:
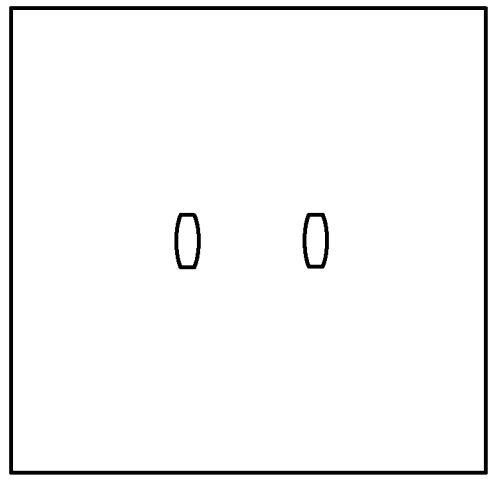
FIGS. 2A and 2B shows two exemplary variants of illumination settings.
Figure 2B:
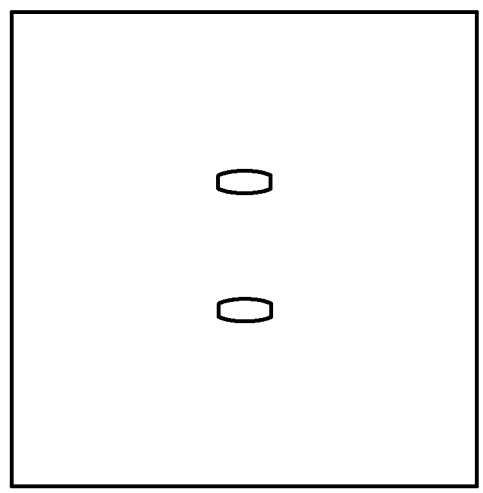
Figure 3:
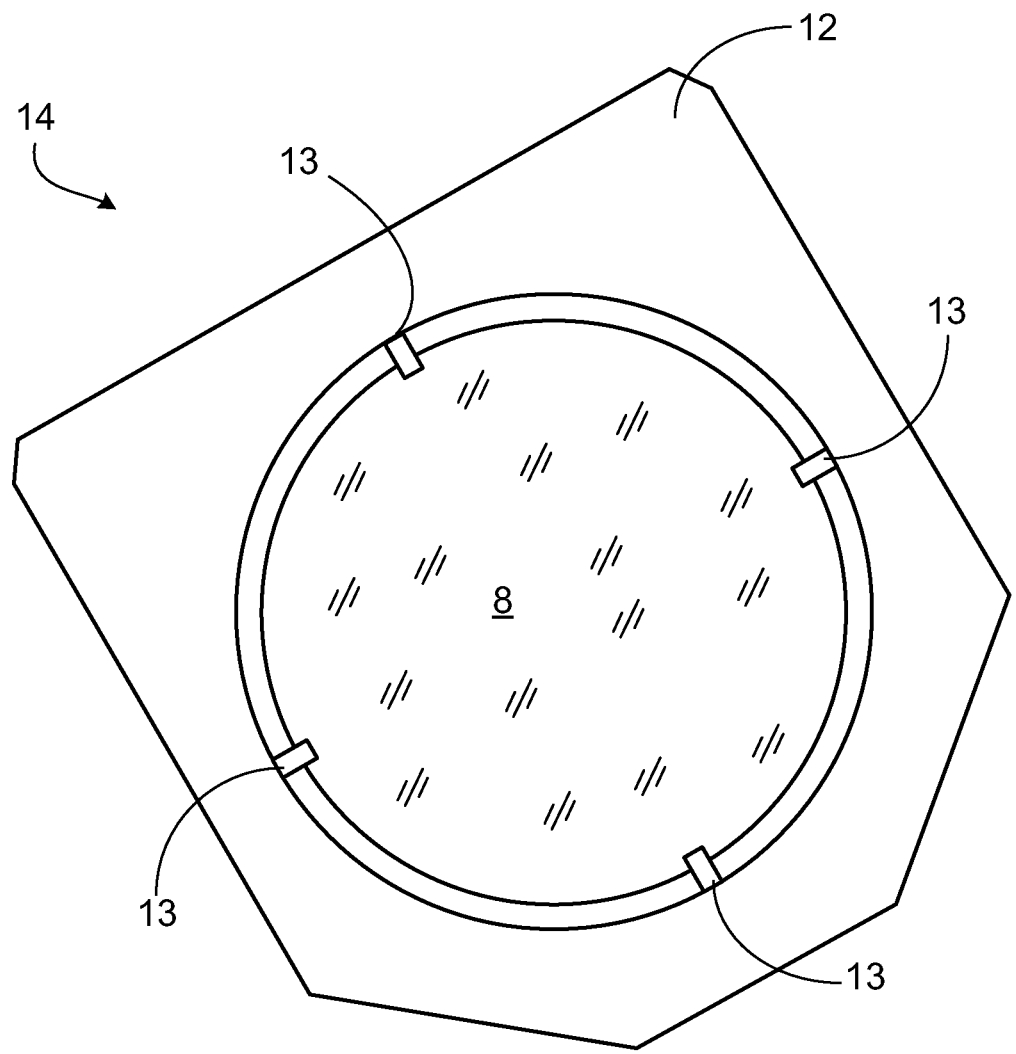
FIG. 3 shows a manipulator for an optical system.

FIGS. 1 and 2 have already been described further above; therefore, no explanation of the figures will be given at this juncture. FIG. 3 shows a manipulator 14 having an optical element arranged in a basic mount 12, a lens 8 in the case illustrated, wherein the lens 8 is connected to the basic mount 12 by actuators 13. In this case, the actuators 13 enable movements of the lens 8 in the direction of the optical axis and tiltings about two tilting axes orthogonal to one another and to the optical axis, and in particular a second-order deformation of the lens 8. It goes without saying that—given a corresponding number of actuators—higher-order deformations of the lens 8 are also conceivable. Likewise, additional bearing elements (not illustrated) may be present, by which the lens 8 is mounted passively, that is to say without actuator functionality, on the basic mount 12. In this case, the manipulator 14 is formed in such a way that it can be inserted into an optical system, for example into the projection objective of a projection exposure apparatus for semiconductor lithography, and be removed again, in a simple manner. In this case, the manipulator 14 can be changed via lateral openings in the projection objective; in this case, the manipulator 14 can be inserted via guide rails into the projection objective in a direction that is essentially orthogonal to the optical axis. It can be seen from FIG. 3 that the manipulator 14 may exhibit a small structural height; in particular, structural heights of <20 mm, for example of <10 mm, are possible.

Figure 4:
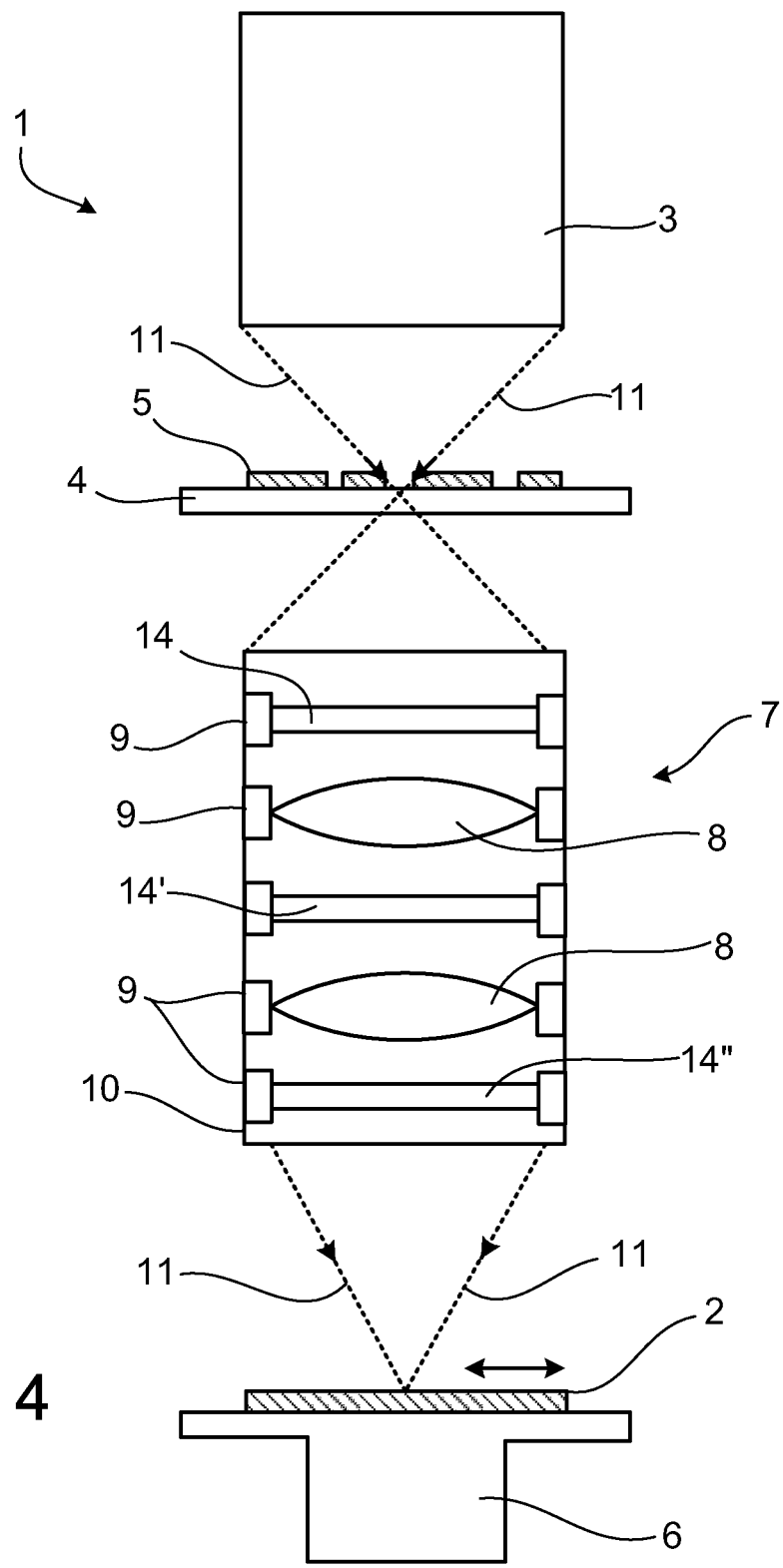
FIG. 4 shows possible installation positions of manipulators in a projection exposure apparatus for semiconductor lithography.

FIG. 4 shows possible installation positions of the manipulators in a projection exposure apparatus for semiconductor lithography. In this case, the apparatus illustrated in FIG. 4 largely corresponds to the projection exposure apparatus according to the prior art as illustrated in FIG. 1, with the difference that the apparatus illustrated in FIG. 4 has the manipulators 14, 14' and 14". In this case, the manipulator 14' is an essentially plane-parallel plate arranged in the region of a pupil plane (not specifically designated), or some other optical correction element such as an asphere, for example, while the manipulators 14 and 14" are arranged near the field and can likewise be formed as essentially plane-parallel plates or else as further optical correction elements.

In this case, it is possible, through corresponding design of the manipulator 14, to address in the future even defects, for example—besides the second-order and fourth-order field-constant image aberrations of lowest order (Z5 and Z17)—also corresponding field-constant image aberrations of higher order (second-order: Z12, Z21, Z32; fourth-order: Z28, . . . . ) or alternatively field-constant aberrations such as Z6, Z13, Z22, Z33, . . . (second-order) and Z18, Z29, . . . , which can be induced when e.g. not only X or Y dipoles but also rotated dipoles are used.

Furthermore, it is conceivable that the field-near or intermediate arrangement of the manipulators in specific cases can also improve the LH correction (especially of field profiles e.g. of Z2/3, Z7/8, Z10/11, Z14/15, Z19/20 . . . ).

The solution thus permits in particular the correction of time-dependent field-constant e.g. Z5, Z6, Z12, Z13 or Z17, Z18 field profiles and also of time-dependent anamorphic Z2/Z3 field profiles or of time-dependent linear Z10/Z11 field profiles (in the full field) in the exit pupil.

In this case, in particular the method described below can be applied for the design of the manipulators:

The time-dependent application-specific aberrations are determined in at least one calibration measurement of an irradiated lithography objective. Afterward, in a second step, an optimum manipulator correction concept is determined for at least one exchangeable manipulator in the objective. A third step involves producing and installing the manipulator for the relevant position in the objective.

In some embodiments, in a first step, the illumination angle distribution and also the approximate reticle structure are determined and the application-specific aberrations of the lithography objective irradiated in this way are thus simulated for different times. In a second step, an optimum manipulator correction concept is determined for at least one manipulator in the objective, and a third step involves producing and installing the manipulator for the relevant position in the objective.

In this case, the concept presented is, of course, not restricted exclusively to the correction of lens heating induced aberrations; the correction of aberrations having a different cause is also conceivable with the concept described.

Figure 5A:
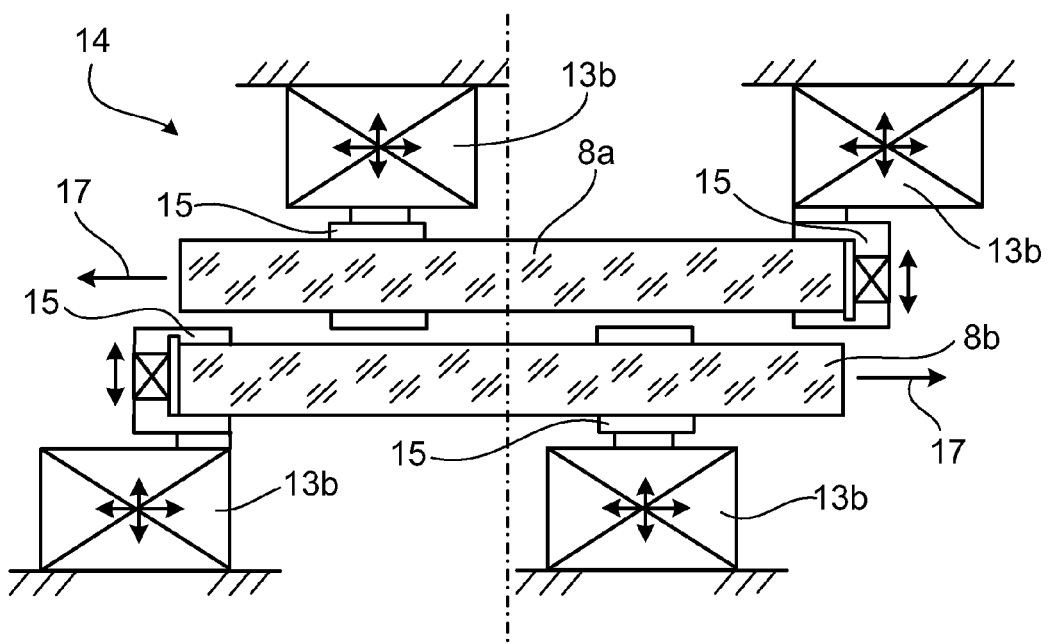
FIGS. 5A and 5B shows a variant of an Alvarez element.

FIG. 5a shows a first optical element formed as a plane plate 8a is arranged such that it can be positioned relative to a second plane plate 8b; an aspheric surface whose form corresponds to the primitive function of the image aberration to be corrected is impressed onto the two plane plates 8a and 8b situated near a pupil of the optical system in such a way that the effects of the wavefront deformations of both plane plates 8a and 8b compensate for one another. It is only when the plane plates are displaced with respect to one another that an effective wavefront deformation arises in the derivative of the impressed aspheric surface—that is to say the image aberration to be compensated for. Such an arrangement is usually referred to as an Alvarez element. In this case, the displacement, rotation or tilting of the plane plates 8a and 8b relative to one another is obtained by the actuators 13b. In the example shown, the clamps 15 are provided for a clamping of the plane plates for the purpose of fixing optionally in a statically determined bearing in the direction of the optical axis, wherein the actuators 13b can realize a displacement both in the direction of the optical axis and essentially orthogonally to the optical axis. The corresponding directions are indicated by arrows in FIG. 6.

It goes without saying that it is also conceivable to design the manipulator (14) such that it can be positioned as a whole, in the direction of the optical axis or orthogonally to the optical axis.

Each of the two plane plates 8a or 8b can in this case be removed from and introduced into the optical system (not illustrated) via lateral openings (likewise not illustrated) of the system.

Figure 5B:
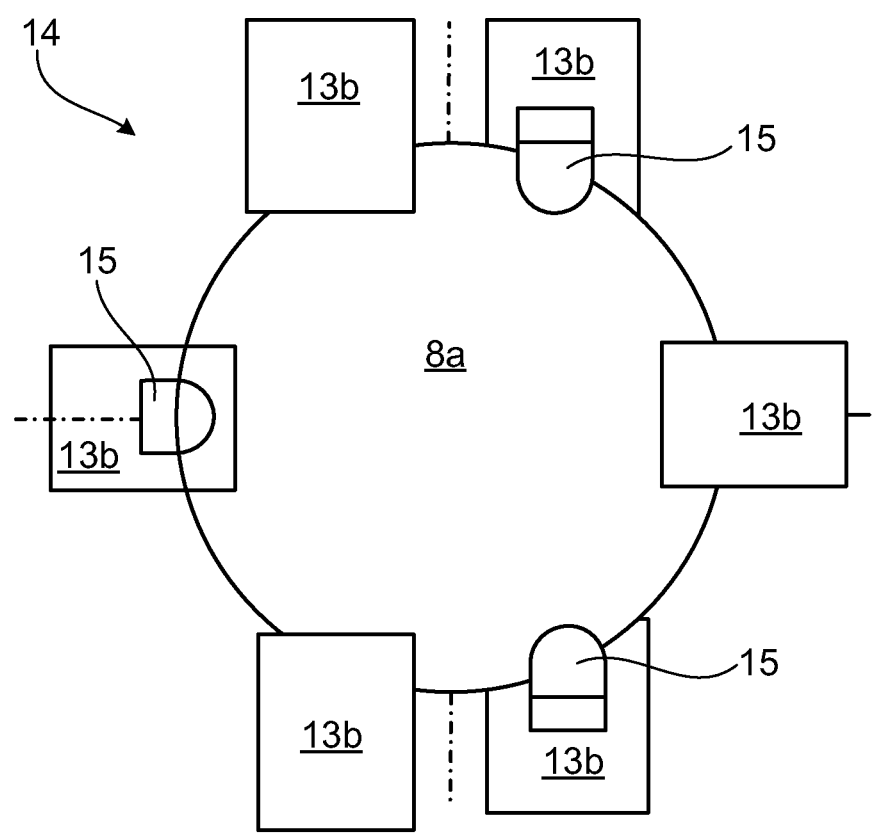
Figure 6A:
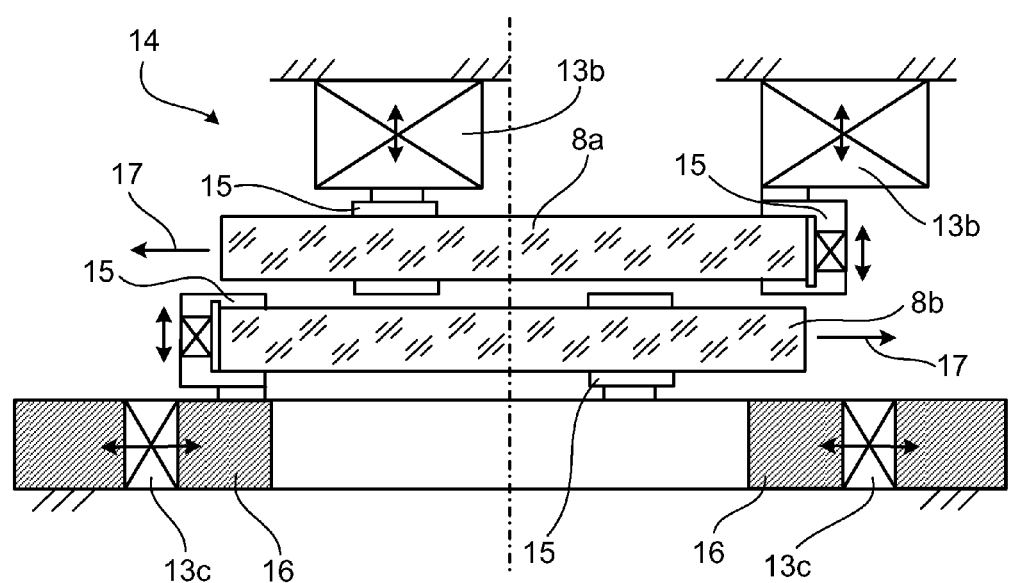
FIGS. 6A and 6B shows a variant of an Alvarez element.
Figure 6B:
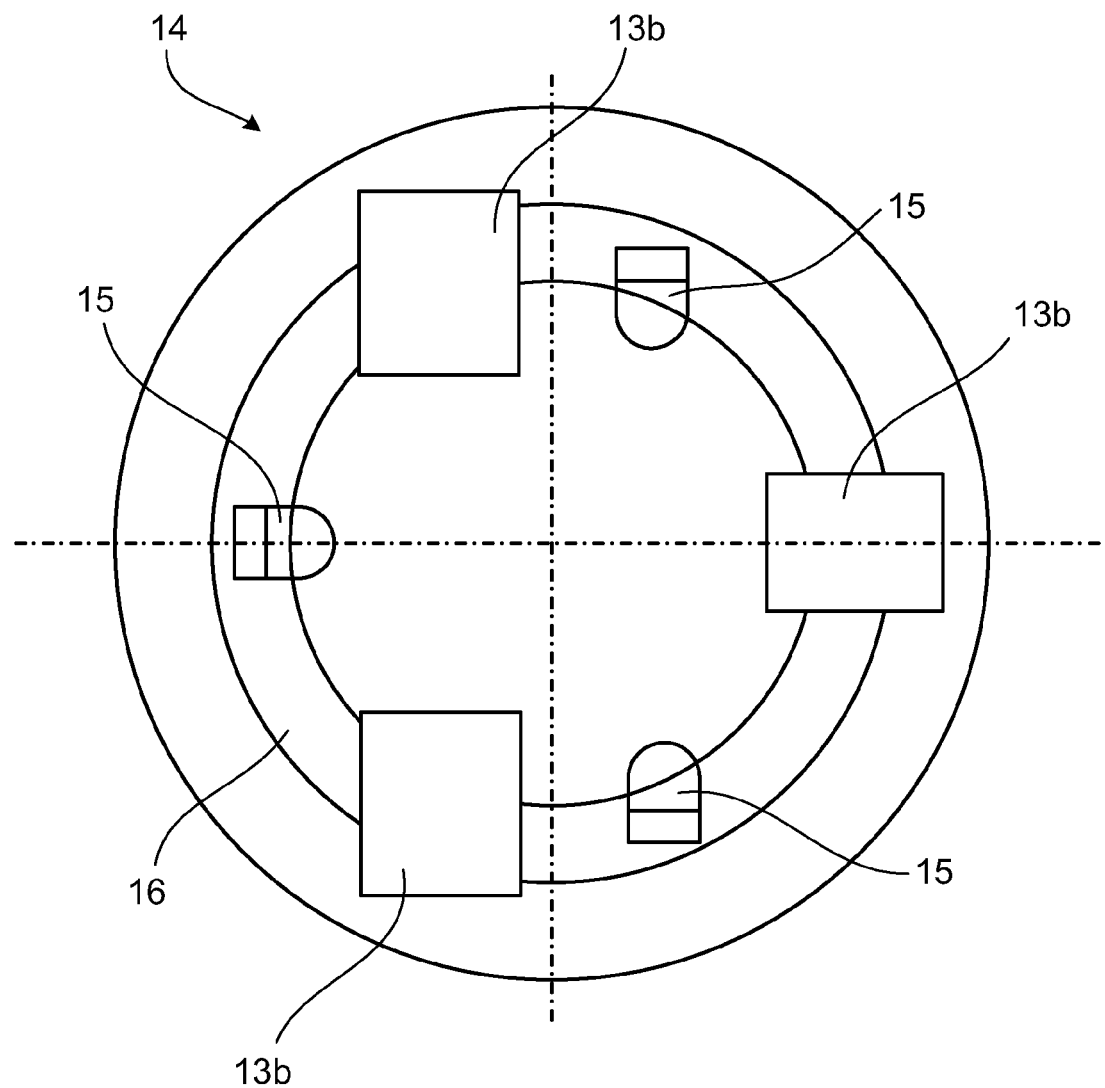
Figure 7:
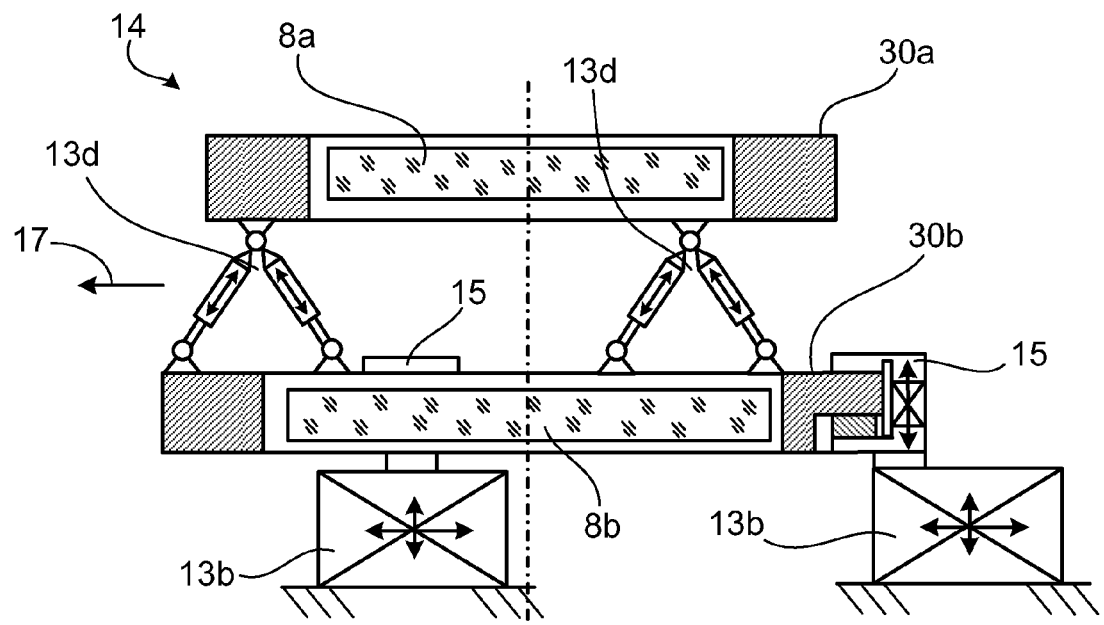
FIG. 7 shows a variant of an Alvarez element.
Figure 8:
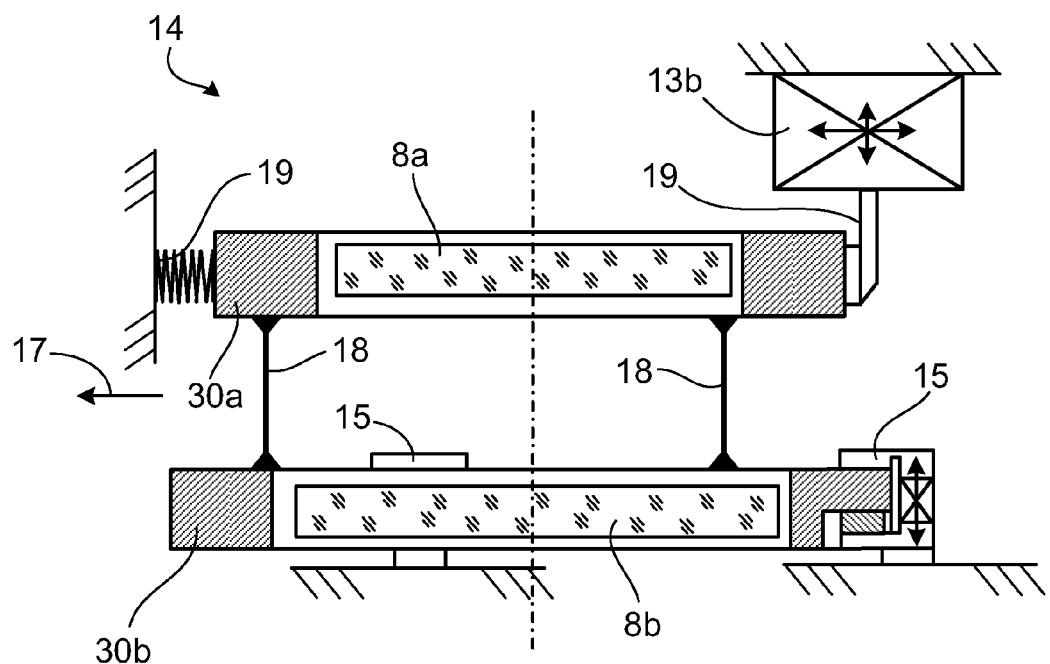
FIG. 8 shows a variant of an Alvarez element.

The direction in which the plane plates 8a and 8b or else the entire manipulator 14 can be removed from the optical system in the event of a change is indicated by the arrow 17 in FIG. 5 and also in the subsequent FIGS. 6 to 8.

The clamps 15 are provided for each of the plane plates 8a and 8b. Furthermore, provision may be made of a first referencing system (not illustrated) for determining the position of the first plane plate 8a relative to the optical system and a second referencing system (likewise not illustrated) for determining the position of the first plane plate 8a relative to the second plane plate 8b. In some embodiments, the first referencing system can be formed by mechanical references at the plane plate 8a or 8b or the mount thereof and at the clamp 15. In certain embodiments, the second referencing system can perform an image aberration measurement of the overall optical system. Furthermore, optically, electrically or magnetically sensible reference marks at the plane plates 8a and 8b themselves are conceivable for the second referencing system.

In this case, the referencing systems described can be utilized by the control in such a way that the plane plates 8a and 8b can be moved relative to one another in a targeted manner.

It becomes clear from figure part 5b, which illustrates a plan view of the arrangement shown in FIG. 5a, that the arrangement has, for both plane plates 8a and 8b, in each case three actuators 13b arranged in each case at an angular distance of approximately 120°. In this case, the actuators 13b of the first plane plate 8a are arranged such that they are rotated relative to the actuators 13b of the second plane plate (not visible) in a manner such that the dimensions of the actuators 13b that are projected in the direction of the optical axis of the optical system do not overlap. In this way it is ensured that the manipulator takes up only a small structural space in the optical system since the actuators 13b can be arranged in interleaved fashion.

FIG. 6 shows in its figure parts 6a and 6b, which illustrates a plan view of the arrangement shown in FIG. 6a, which makes use of the fact that it is not always necessary for each of the plane plates 8a, 8b to be moved in all six degrees of freedom of movement. FIG. 6 illustrates that the second plane plate 8b is arranged on a ring-shaped device 16 for adjusting the position in the lateral plane perpendicular to the optical axis by the actuators 13c. In this case, the plane plates 8b/8a are additionally provided with the clamps 15 that enable the plane plates 8a/8b to be clamped. The first plane plate 8a can be moved in the direction of the optical axis by the actuators 13b assigned to it. This has the effect that a relative movement of the plane plates 8a, 8b with respect to one another and with respect to the rest of the optical system in the five major degrees of freedom (x, y, z, Rx and Ry) is possible.

FIG. 7 illustrates the case where the actuator system of the manipulator 14 is formed in changeable fashion together with the manipulator 14 itself. In this case, a relative movement of the two plane plates with respect to one another is made possible by the actuators 13d connected to the mounts 30a and 30b of the plane plates 8a and 8b; the movement of the manipulator 14 as a whole in the optical system is ensured by the actuators 13b, to which the mount 30b of the plane plate 8b is fixed by the clamps 15. The position of the two plane plates 8a and 8b with respect to one another can be determined by a referencing system (not illustrated). A further referencing system (likewise not illustrated) is arranged at the changeable manipulator itself in a manner such that it is possible to perform and determine the positioning of the manipulator by a fixing mechanism—which is arranged on actuators—overall with respect to the optical system. The plane plate 8b could additionally have an actuator system for six degrees of freedom which move the plate in the mount 30b.

FIG. 8 shows that when the manipulator 14 is exchanged, the clamps 15 and the actuators 13b remain in the optical system, the optical elements of the manipulator being held by the clamps 15 and actuators 13b in their mounts 30a and 30b and being connected to one another by a movement guidance system 18. This simplification is expedient particularly when only two degrees of freedom are involved for the relative displacement of the two plane plates 8a and 8b with respect to one another. In the variant illustrated in FIG. 8, the manipulator 14 is provided with a movement guidance system 18, which defines the possible movements of the two plane plates 8a and 8b with respect to one another. Furthermore, the manipulator 14 is fixed exclusively by the mechanical references within the optical system; when the manipulator 14 is changed, the clamps 15 and the actuators 13*b* remain in the optical system.

Particularly in the case of thin optical elements it is advantageous to superimpose the asphere for generating the lens heating compensation with a compensation of inherent weight effects at the optical element itself. This basic possibility of superimposing aspherizations additionally makes it possible to carry out further compensations of image aberrations having different causes. By way of example, it is possible to compensate in parallel for drift effects or damage of the optical material of any desired optical element in the superordinate system by laser irradiation.

If the optical system has more than one pupil, it is not absolutely necessary for the two plane plates provided with the asphere to lie near a pupil; rather, in some embodiments, they can also be arranged in a manner distributed between different pupil planes.

In order to achieve a fast aberration correction, it is possible to determine the desired alteration of the position of the first plane plate 8*a* relative to the second plane plate 8*b* for the desired image aberration correction beforehand on the basis of a model; the corresponding parameters can subsequently be stored in a control system and be retrieved. In this case, the control system may be part of the referencing system.

The use of non-rotationally symmetrical basic mounts for the mounting of the optical element in the manipulator leads to the problem area outlined below: if the actuators exert forces on the lens during a lens adjusting operation, then conversely forces are also exerted on the basic mount or introduced into the latter. The forces lead to a deformation of the basic mount. A difficulty can occur, then, in that the basic mount, on account of its geometry, does not deform in a rotationally symmetrical manner, which in turn leads to an impairment of the controllability of the deformation of the optical element.

Figure 9:
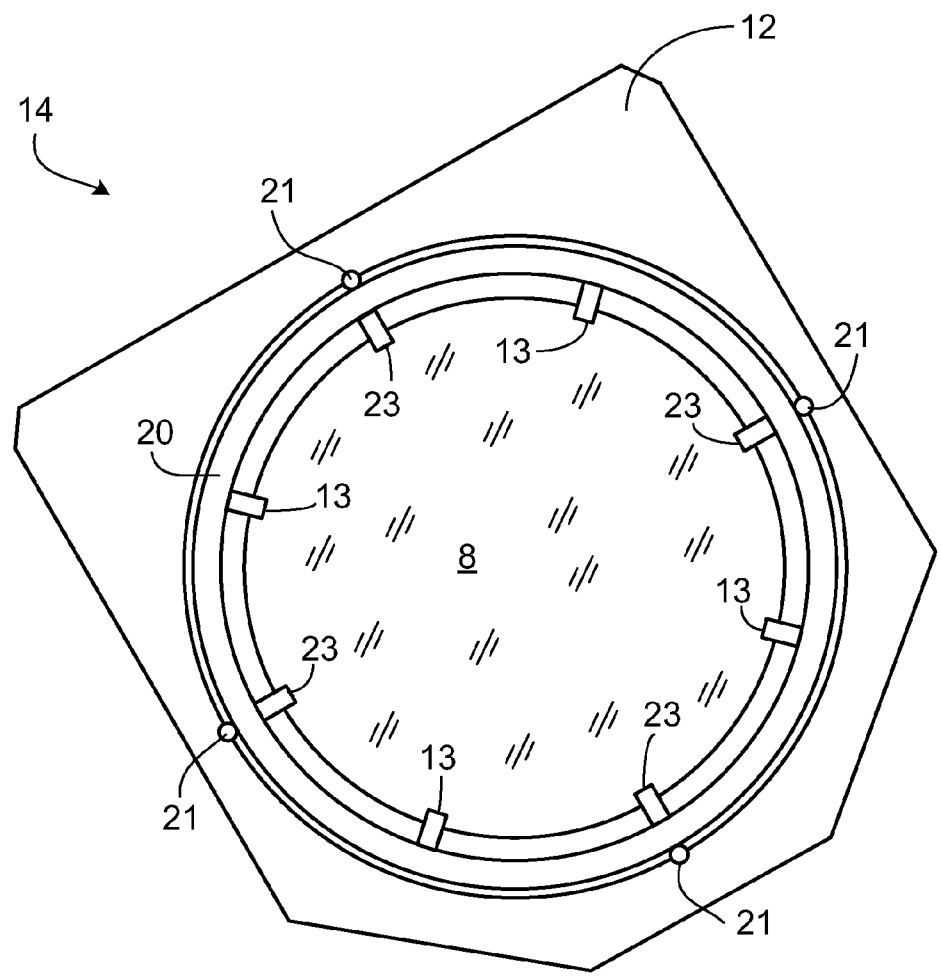
FIG. 9 shows a manipulator with a ring-shaped inner mount.
Figure 10:
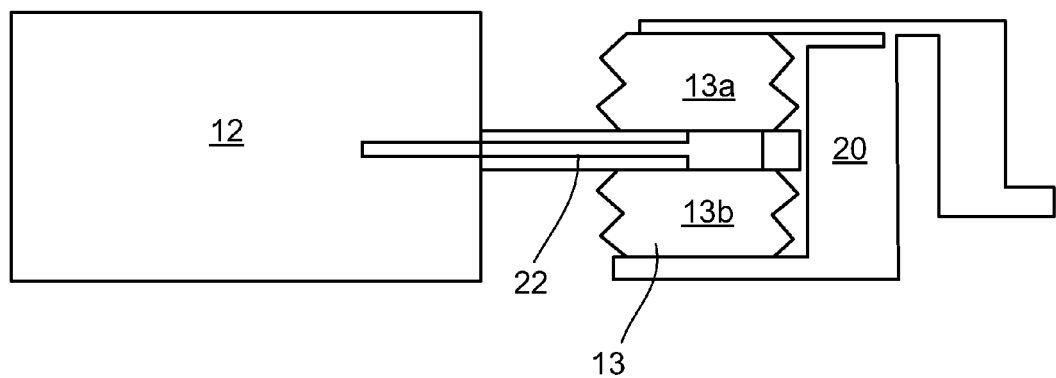
FIG. 10 shows an actuator for use in a manipulator.
Figure 11:
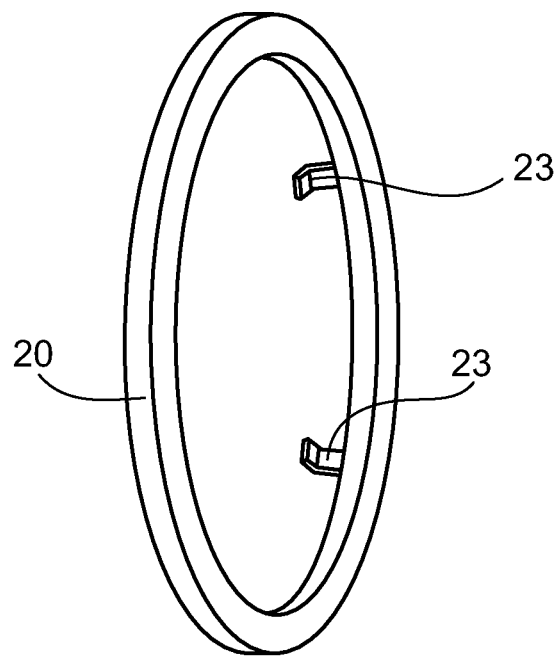
FIG. 11 shows an inner mount provided with bearing elements according to the prior art.

FIG. 9 shows a manipulator with a ring-shaped inner mount. FIG. 10 illustrates a manipulator 14 having, alongside the basic mount 12 and the optical element formed as a lens 8, also an inner mount 20, in which the lens 8 is arranged over four actuators 13 arranged at an angular distance of 90° and the bearing elements 23 likewise arranged at an angular distance of 90°. In this case, the inner mount 20 is formed in rotationally symmetrical fashion with respect to an optical axis of the optical system. This affords the advantage that in the case where forces are introduced into the lens 8 via the actuators 13, the inner mount 20, on account of its rotationally symmetrical geometry, deforms likewise rotationally symmetrically as a reaction to the forces acting, such that the resulting deformation and—in the case of an embodiment of the bearing elements 23 as additional actuators—tilting of the lens 8 can be controlled better. The inner mount 20 is connected to the basic mount 12 at the four connecting points 21; however, no or only small forces are introduced into the basic mount 12 via the connecting points 21. It would also be conceivable to have a realization with only three connecting points 21 or an arrangement offset at 45°, such that the connecting points 21 would be situated at the same angular positions as the actuators 13. In some embodiments, the inner mount 20 is connected to the basic mount 12 via at least three connecting points 21 formed as elastic articulations.

In some embodiments, the actuator is a bellows to which a fluid can be applied and which is connected to the basic mount via a feed line in a manner such that the feed line leads into the bellows without being in direct mechanical contact with the inner mount. The variant discussed is explained in more detail below with reference to FIG. 10:

FIG. 10 shows an arrangement including basic mount 12, actuator 13 formed as bellows, feed line 22 and inner mount 20. The special feature of the variant illustrated consists here in the fact that the bellows 13 is divided into the two bellows parts 13*a* and 13*b*, which are arranged in a u-shaped cutout of the inner mount 20; in this case, the feed line 22 emerging from the basic mount 12 leads directly into the bellows 13 in the region between the two bellows parts 13*a* and 13*b*. The fact that the feed line 22 is connected to the inner mount 20 only via the two bellows parts 13*a* and 13*b* results in effective decoupling of the feed line 22 from the inner mount 20. If a sufficiently low stiffness of the bellows 13 is assumed, for example, then no or only a small force is transmitted to the feed line 22 and thus to the basic mount 12 as a result of movements of the inner mount 20. This is because in the case of a movement of the inner mount 20, the u-shaped part of the inner mount 20 can move relative to the feed line 22 since—as already mentioned—as a result of the comparatively soft bellows 13, no force is transmitted to the feed line 22 and thus to the basic mount 12.

FIGS. 11 to 14 illustrate a variant for the realization of bearing elements by which the optical element 8 can be fixed in the inner mount 20, in particular, in which the bearing elements 23 are formed as modular elements. According to the prior art illustrated in FIG. 12, optical elements are mounted in inner mounts 20 with bearing elements 23, the bearing elements 23 being integrally connected to the inner mount 20. In this case, firstly a turning contour of the bearing element cross section is produced by a turning process and then the bearing elements 23 are produced and separated by an erosion process. This procedure has the disadvantage, however, that the geometrical configuration possibilities are restricted by the turning method and the erosion method because the machining in this case is possible only in few degrees of freedom. For optical elements 8 which are fixed to their respective mount part by few, in particular fewer than seven, bearing elements 23, it is appropriate for the bearing elements 23 not to be manufactured integrally with the inner mount 20, but rather to be produced as individual parts. This procedure affords the advantage of increasing the degrees of freedom in the geometrical configuration of the bearing elements 23 since the machining can be effected from a large number of directions.

Figure 12:
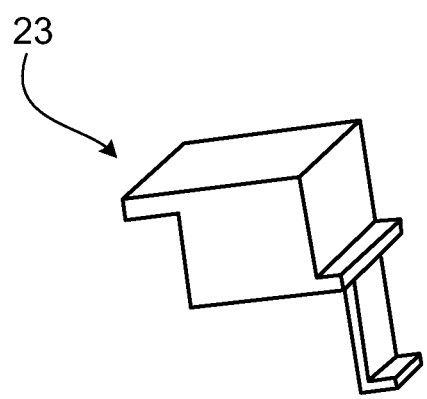
FIG. 12 shows a modular bearing element.

FIG. 12 shows a bearing element 23 manufactured in modular fashion; it can clearly be discerned that the bearing element 23 can be machined from a large number of directions.

Figure 13A:
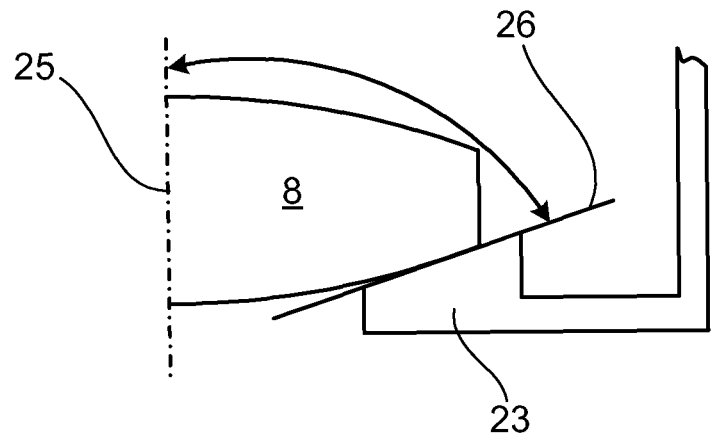
FIGS. 13A and 13B shows an illustration of the bearing of a lens on bearing elements for different lens radii.
Figure 13B:
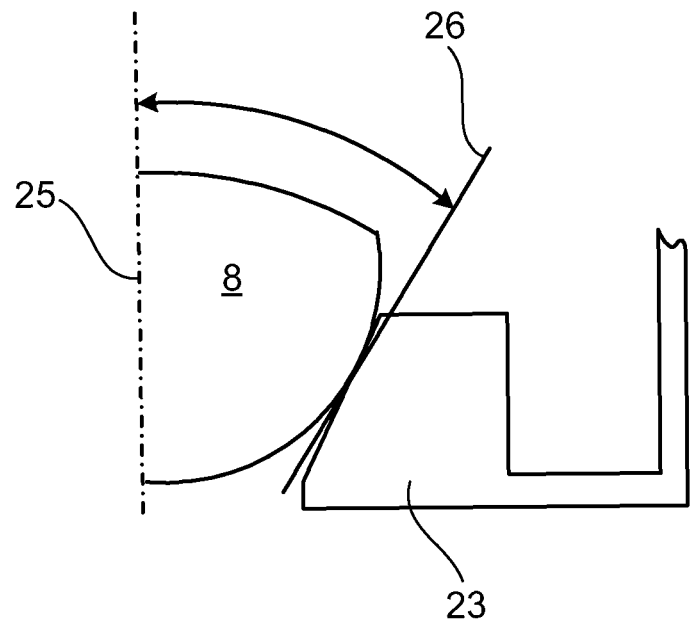

FIG. 13 shows the conditions in the region of the bearing of an optical element, which is formed as a lens 8 in this case, on the bearing element 23. For the case illustrated in FIG. 13*a* where the lens 8 has a large radius of curvature on the side facing the bearing area 24, the desired properties regarding the precision and the manufacturing tolerance of the bearing area 24 are low since, in the case of the large angles mentioned, an alteration of the position of the lens 8 in the direction of the optical axis is unlikely. As the radii of the corresponding surface become smaller, the conditions change, as illustrated in FIG. 13*b:*

A smaller angle arises between the optical axis 25 and the tangent 26 to the surface of the lens 8 in the bearing region, such that the dimensional tolerance involved for reliable bearing of the lens 8 on the bearing area 24 decreases. The tolerances to be achieved that are involved for this case can be realized only in a very complicated manner by the conventional method of turning and subsequent erosion; furthermore, an increased susceptibility to errors arises. The low tolerance involved can now advantageously be achieved by—manufacturing the mount firstly without bearing element 23, but with very accurate bearing areas for the modular bearing elements 23. The modular bearing elements 23 are subsequently produced individually in each case for the application of the inner mount 20. In this case it becomes possible to realize the modular bearing elements 23 significantly more accurately than in the case of bearing elements 23 formed integrally with the inner mount 20.

Figure 14:
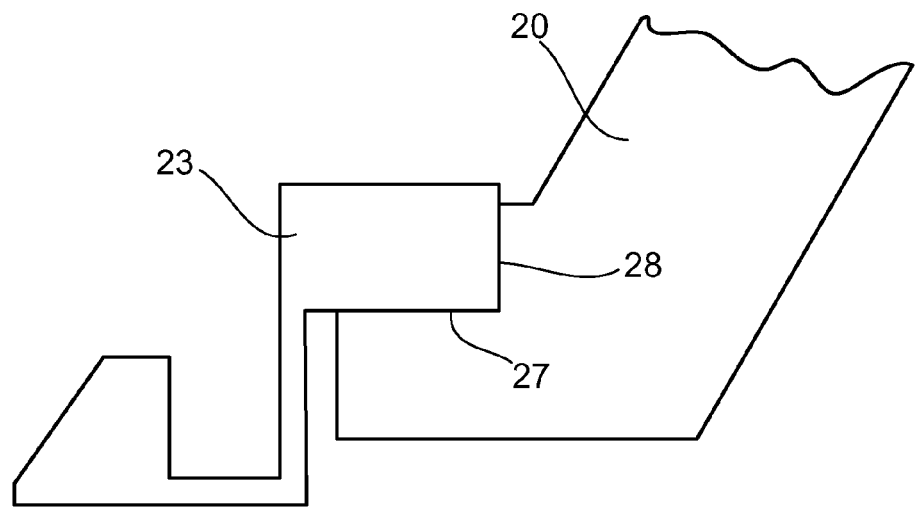
FIG. 14 shows a bearing element that is arranged in an inner mount.

FIG. 14 shows the bearing element 23 manufactured in modular fashion and arranged on an inner mount 20 by the fitting areas 27 and 28. It becomes clear from this that for an exact positioning of an optical element 8 in the inner mount 20 by the bearing elements 23, stringent desired properties have to be made of the manufacturing tolerances in particular also of the two fitting areas 27 and 28. On account of the modular production manner of the bearing elements 23 and the inner mount 20, however, the tolerances can be complied with significantly more easily than the tolerances that would have to be complied with in the case of an integral form of realization.

Figure 15:
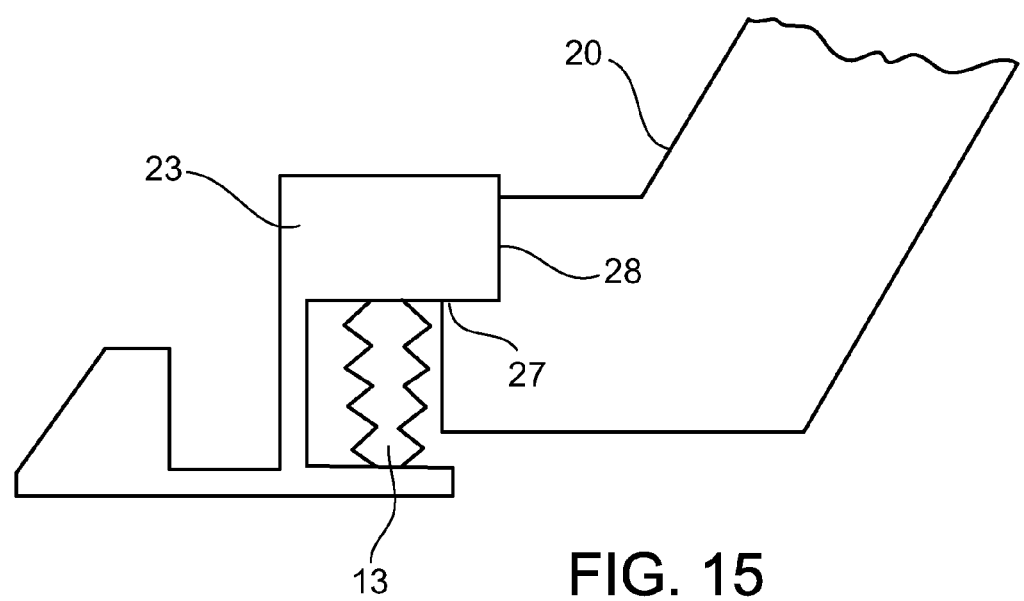
FIG. 15 shows a bearing element that is arranged in an inner mount, with an adjustment possibility.

In addition, there is the possibility—illustrated in FIG. 15—of realizing the bearing elements 23 in a manner such that an actuator 13 can be integrated into this. This measure enables the above-described functionality of bending of the optical element.

What is claimed is:

1. A manipulator, comprising:
an actuator; and
an optical element which is manipulable by the actuator, wherein:
the manipulator is configured to be disposed in a semiconductor lithography optical system; and
the manipulator is exchangeable with a second manipulator in the semiconductor lithography optical system so that, after the manipulator is exchanged with the second manipulator, the semiconductor lithography optical system does not include the second manipulator.

2. The manipulator of claim 1, wherein the manipulator comprises a plurality of optical elements, and the actuator is configured to position the optical elements with respect to one another.

3. The manipulator of claim 2, wherein the optical elements are exchangeable without exchanging the actuator.

4. The manipulator of claim 2, wherein at least one of the optical elements comprises at least one aspheric surface.

5. The manipulator of claim 4, wherein, when the manipulator is present in the semiconductor lithography optical system, a deformation of a wavefront propagating in the semiconductor lithography optical system arises in the event of a displacement, rotation or tilting of the surfaces of the optical elements relative to one another.

6. The manipulator of claim 1, wherein, when the manipulator is present in the semiconductor lithography optical system:
the manipulator or at least one of its component parts is moveable in a direction of an optical axis of the semiconductor lithography optical system; or
the manipulator or at least one of its component parts is moveable in a direction orthogonal to the optical axis of the semiconductor lithography optical system.

7. The manipulator of claim 1, wherein the optical element comprises an Alvarez element.

8. The manipulator of claim 1, wherein, when the manipulator is disposed in the semiconductor lithography optical system:
two adjacent optical elements of the manipulator are essentially orthogonal in terms of their lateral extent with respect to an optical axis of the semiconductor lithography optical system; and
dimensions of the two adjacent actuators projecting in the direction of the optical axis of the semiconductor lithography system do not overlap.

9. The manipulator as of claim 8, wherein each of the two adjacent optical elements comprises an essentially circular optical element, and three actuators are arranged at each of the two adjacent optical at an angular distance of 120° with respect to each other.

10. The manipulator of claim 1, comprising:
a first optical element;
a first actuator configured to move the first optical element in a direction;
second optical element; and
a second actuator configured to move the second optical element in the direction and also configured to tilt the second optical element along two axes.

11. The manipulator of claim 1, wherein the optical element is exchangeable in the semiconductor lithography optical system without exchanging the actuator.

12. The manipulator of claim 1, further comprising a movement guidance system, wherein at least two optical elements of the manipulator are connected to each other by the movement guidance system.

13. The manipulator of claim 1, further comprising a basic mount and an inner mount arranged in the basic mount, wherein the optical element is supported by the inner mount.

14. The manipulator of claim 13, wherein the inner mount is configured so that, when the manipulator is in the semiconductor lithography optical system, the inner mount is essentially rotationally symmetric with respect to an optical axis of the semiconductor lithography optical system.

15. The manipulator of claim 13, wherein the actuator is on the inner mount.

16. The manipulator of claim 15, comprising four actuators arranged at an angular distance of approximately 90° on the inner mount.

17. The manipulator of claim 16, comprising an additional bearing element on the inner mount.

18. The manipulator of claim 17, wherein the bearing element is not formed integrally with the inner mount.

19. The manipulator of claim 15, wherein at least one of the actuators comprises a bellows connected to the basic mount via a feed line so that the feed line leads into the bellows without being in direct mechanical contact with the inner mount.

20. The manipulator of claim 19, wherein the feed line is arranged essentially centrally between two opposite parts of the bellows, and the opposite parts of the bellows are supported on the inner mount.

21. The manipulator of claim 8, wherein the inner mount is connected to the basic mount via at least three connecting points configured as elastic articulations.

22. The manipulator of claim 1, wherein the manipulator has a structural height of less than 20 millimeters in a direction of an optical axis of the semiconductor lithography optical system.

23. The manipulator of claim 1, wherein the actuator comprises a member selected from the group consisting of a thin-walled metal bellows, a piezoactuator, a Lorentz actuator, a thermal actuator and a hydraulic actuator.

24. The manipulator of claim 1, wherein the semiconductor lithography optical system is an illumination system of a semicondutor projection exposure apparatus.

25. The manipulator of claim 1, wherein the semiconductor lithography optical system is a projection objective of a semicondutor projection exposure apparatus.

26. The manipulator of claim 1, wherein, when the manipulator is in the semiconductor lithography optical system, the manipulator is a distance from a pupil of the semiconductor lithography optical system which corresponds to a subaperture ratio of a magnitude of less than 0.25.

27. The manipulator of claim 1, wherein the actuator is configured to deform the optical element.

28. The manipulator of claim 1, wherein the actuator is configured to influence a temperature of regions of the optical element.

29. The manipulator of claim 1, wherein the actuator is configured to heat regions of the optical element.

30. The manipulator of claim 1, wherein the actuator comprises an electromagnetic radiation source configured to heat the optical element.

31. The manipulator of claim 1, wherein the manipulator is arrangeable in the semiconductor lithography optical system in place of a non-manipulable exchangeable optical correction element.

32. The manipulator of claim 1, wherein the manipulator is configured to replace a second manipulator which has a number or type of degrees of freedom different from that of the manipulator, and the type of degrees of freedom are selected from the group consisting of linear translations, rotations and combinations thereof.

* * * * *

UNITED STATES PATENT AND TRADEMARK OFFICE
CERTIFICATE OF CORRECTION

PATENT NO.         : 8,659,745 B2                                     Page 1 of 1
APPLICATION NO.    : 13/921312
DATED              : February 25, 2014
INVENTOR(S)        : Guido Limbach et al.

It is certified that error appears in the above-identified patent and that said Letters Patent is hereby corrected as shown below:

On the Title Page, Item [72] Col. 1 (Inventors), line 5, delete "DE (US);" and insert -- (DE); --.

In the Claims

Col. 12, line 20, in Claim 10, before "second" insert -- a --.

Col. 13, line 3, in Claim 24, delete "semicondutor" and insert -- semiconductor --.

Col. 13, lines 5-6, in Claim 25, delete "semicondutor" and insert -- semiconductor --.

Signed and Sealed this
Twenty-seventh Day of May, 2014

Michelle K. Lee
*Deputy Director of the United States Patent and Trademark Office*